(12) United States Patent
Kang et al.

(10) Patent No.: US 7,618,674 B2
(45) Date of Patent: Nov. 17, 2009

(54) DEPOSITION MASK AND METHOD FOR MANUFACTURING ORGANIC LIGHT EMITTING DISPLAY USING THE SAME

(75) Inventors: Chang-Ho Kang, Suwon-si (KR); Tae-Seung Kim, Suwon-si (KR); Jae-Min Hong, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 767 days.

(21) Appl. No.: 11/180,653

(22) Filed: Jul. 14, 2005

(65) Prior Publication Data

US 2006/0012280 A1    Jan. 19, 2006

(30) Foreign Application Priority Data

Jul. 15, 2004    (KR) ................... 10-2004-0055072

(51) Int. Cl.
*B05D 5/06* (2006.01)
*C23C 16/00* (2006.01)
(52) U.S. Cl. .................. 427/66; 427/70; 427/282; 118/721
(58) Field of Classification Search .............. 118/721; 427/66, 69–70, 282
See application file for complete search history.

(56) References Cited

U.S. PATENT DOCUMENTS

| 5,952,037 | A  | * | 9/1999 | Nagayama et al. ............ 427/66 |
| 2001/0002703 | A1 | * | 6/2001 | Koyama ....................... 257/40 |
| 2002/0025406 | A1 | * | 2/2002 | Kitazume .................... 428/136 |
| 2003/0015140 | A1 | * | 1/2003 | Van Slyke et al. ...... 118/723 VE |
| 2003/0117071 | A1 | * | 6/2003 | Lee et al. ..................... 313/512 |
| 2003/0180474 | A1 | * | 9/2003 | Nishikawa .................. 427/468 |
| 2005/0199580 | A1 | * | 9/2005 | Yang et al. .................... 216/12 |

FOREIGN PATENT DOCUMENTS

JP      2003-257650      9/2003
KR   10-2002-0027959    4/2002

* cited by examiner

*Primary Examiner*—Timothy H Meeks
*Assistant Examiner*—Jimmy Lin
(74) *Attorney, Agent, or Firm*—H.C. Park & Associates, PLC

(57) ABSTRACT

A deposition mask and a method for manufacturing an organic light emitting display (OLED) using the same are provided. The deposition mask is intended for preventing an organic film from being damaged due to touching of a blocked-off portion of the mask to an emission layer (EML), or chemical transition from being generated at the organic film. For that purpose, the deposition mask stuck to a substrate of the OLED to deposit an organic EML includes an opening and an indentation. The opening is opened so as to deposit the organic EML. The indentation is indented a predetermined depth from a plane facing the substrate.

9 Claims, 7 Drawing Sheets

DEPOSITION MASK AND METHOD FOR MANUFACTURING ORGANIC LIGHT EMITTING DISPLAY USING THE SAME

CROSS-REFERENCE TO RELATED PATENT APPLICATION

This application claims the benefit of Korean Patent Application No. 10-2004-0055072, filed on Jul. 15, 2004, which is incorporated herein in its entirety by reference.

BACKGROUND OF THE INVENTION

1. Field of the Invention

The present invention relates to a deposition mask and a method for manufacturing an organic light emitting display (OLED) using the deposition mask. More particularly, the invention relates to a deposition mask that can be used in depositing an organic emission layer (EML) and a method for manufacturing the OLED with such an EML.

2. Description of the Related Art

An OLED typically includes a first electrode formed in a predetermined pattern on a transparent insulation substrate, an organic film formed by, for example, vacuum deposition on the first electrode, and a second electrode formed on an upper surface of the organic film.

The first electrode is generally made of a transparent conductor such as indium tin oxide (ITO) or indium zinc oxide (IZO) and pattering of the transparent conductor is typically performed by a photolithography method.

Photolithography can be used before the organic film is formed but may not be used after the organic film is formed. This is because the organic film may be very vulnerable to moisture and thus may require thorough isolation from moisture during and after the manufacturing process. Therefore, photolithography that exposes the organic film to moisture during a resist exfoliation or etching may not be appropriate for patterning the organic film and the second electrode.

To solve the above-described problem, the organic film and the second electrode layer may be manufactured by vacuum deposition using a mask having a predetermined pattern. Particularly, the second electrode can be patterned using a cathode separator which is a predetermined isolation wall. However, a small molecular organic film may be most appropriately patterned by vacuum deposition using a deposition mask.

An emission layer (EML) may be manufactured by a method in which respective pixels of red (R), green (G), and blue (B) are independently deposited on a substrate so as to provide a full color display. Since the respective colors are independently deposited, separate masks may be required for each color.

As shown in FIG. 1, four panel regions 11 may be deposited on a substrate 10. The respective panel regions 11 can be formed on one substrate 10 and can be cut off and used separately. Only four panel regions have been formed in FIG. 1, but a further larger number of panel regions can be simultaneously manufactured in a real process. A panel region can refer to a region where an OLED is formed on the substrate.

In FIG. 1, the OLEDs formed on the respective panel regions 11 can have an icon part 12 and a main image part 13. The icon part 12 can have red, green, and blue light emission regions 12R, 12G, and 12B. The main image part 13 can be configured so as to realize full color display.

To deposit EMLs of these elements red, green, and blue masks 14R, 14G, and 14B may be used, as illustrated in FIGS. 2A through 2C. The respective masks 14R, 14G, and 14B may have icon masking parts 15R, 15G, and 15B for depositing the icon part 12 and may have main masking parts 16R, 16G, and 16B for depositing the main image part 13.

If the EMLs are deposited using the respective masks 14R, 14G, and 14B, only portions that correspond to the respective colors of the EMLs may be opened and the other portions may be blocked off in the mask as illustrated in FIGS. 2A through 2C. The portions blocked-off by the mask might be touched by the EML already deposited or other hole transport layer (HTL) or hole injection layer (HIL) during deposition process of the EML. This can damage the organic film. The damage might act as a dark spot afterwards.

As described above, the blocked-off portion of the mask can contact the organic film. In such a case, particles of material forming the organic film might fall onto a region where light emission occurs and have a negative influence on the organic film.

Japanese patent publication No. 2003-257650 discloses a structure in which a spacer (made of insulation body) is formed in a region where light emission does not occur. However, even in that case, a blocked-off portion of the mask may touch the spacer and thus small fragments (and fragments of the spacer) and outgasing may have a negative influence on the organic film.

SUMMARY OF THE INVENTION

The present invention provides a deposition mask and a method for manufacturing an organic light emitting display (OLED) using the same capable of preventing an organic film from being destroyed or chemical transition from occurring due to contact of sealed portion of the mask and an EML already deposited during a deposition process of an organic EML.

The present invention may inure various advantages. First, the indented portion of the mask may not touch already deposited organic EML, thereby preserving the organic EML. Second, it may be possible to prevent chemical transition from occurring at the organic EML. Third, the deposition mask can be obtained in a simple method and additional processes may not be required for the OLED manufacturing process. Thus, productivity can be improved.

The present invention provides, for example, a deposition mask that can include a generally planar portion, an opening in the planar portion adapted to permit deposition of an organic emission layer on a substrate of an organic light emitting display, and an indentation in the planar portion indented, having a predetermined depth on a side of the planar portion facing the substrate. Only a portion of the mask may contact the substrate, and that portion may firmly contact the substrate.

The present invention also provides, for example, a method of manufacturing an organic light emitting display. The method may include forming a first electrode on a substrate, forming an organic emission layer on an upper portion the first electrode, and forming an organic emission layer on the first electrode by firmly contacting a mask to the substrate and depositing emission layer material through the mask. The mask may have an opening and an indentation that does not contact the substrate, and the emission layer material may be deposited through the opening. The method may also include forming a second electrode on an upper portion of the organic emission layer and sealing the substrate.

The present invention also provides, for example, a method of manufacturing an organic light emitting display. The method may include, for example, forming a first electrode on a plurality of panel regions of a substrate, and forming an organic emission layer on the first electrode by firmly contacting a mask to the substrate and depositing emission layer material through the mask. The mask may have an opening and an indentation that does not contact the substrate, and the emission layer material may be deposited through the opening. The method may also include forming a second electrode on an upper portion of the organic emission layer, sealing the substrate, and dividing the substrate by panel region unit.

DETAILED DESCRIPTION OF THE INVENTION

The present invention will now be described more fully with reference to the accompanying drawings, in which exemplary embodiments of the invention are shown.

Figure 1:
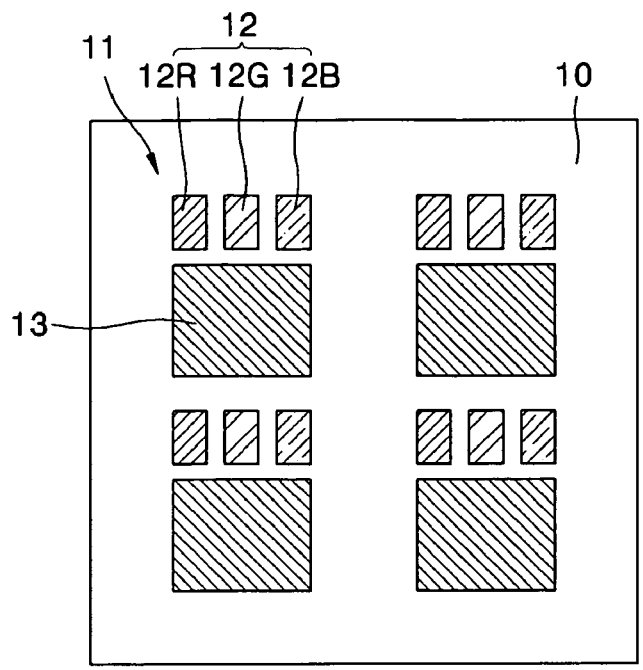
FIG. 1 is a plan view illustrating a state in which an OLED is formed on the substrate.
Figure 2A:
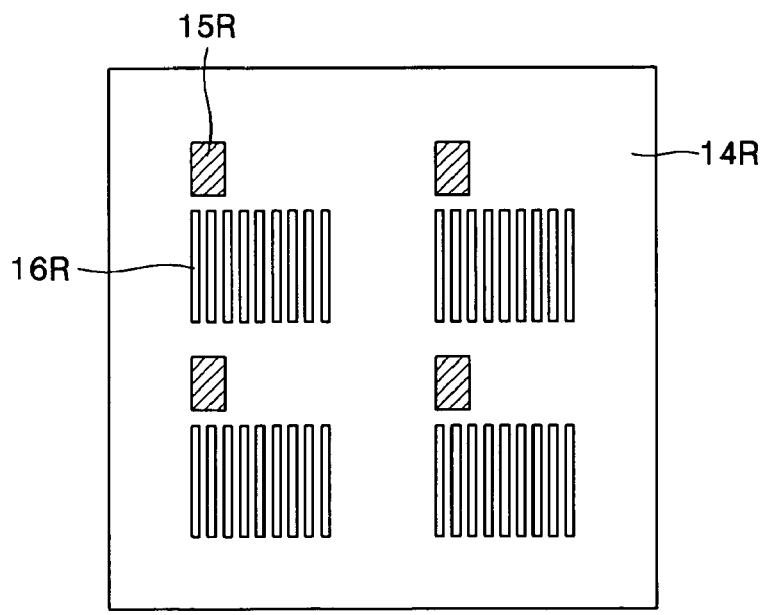
FIG. 2A, FIG. 2B, and FIG. 2C are plan views of deposition masks for depositing red, green, and blue organic EMLs, respectively.
Figure 2B:
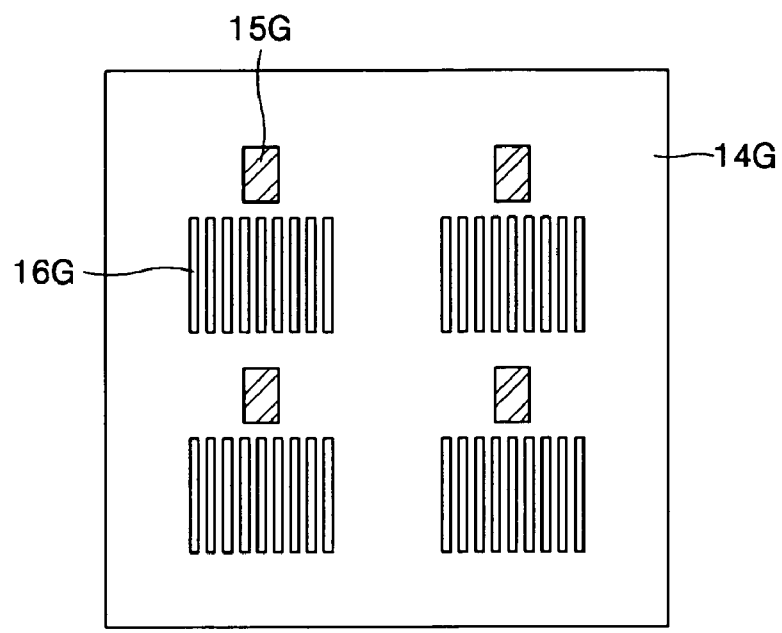
Figure 2C:
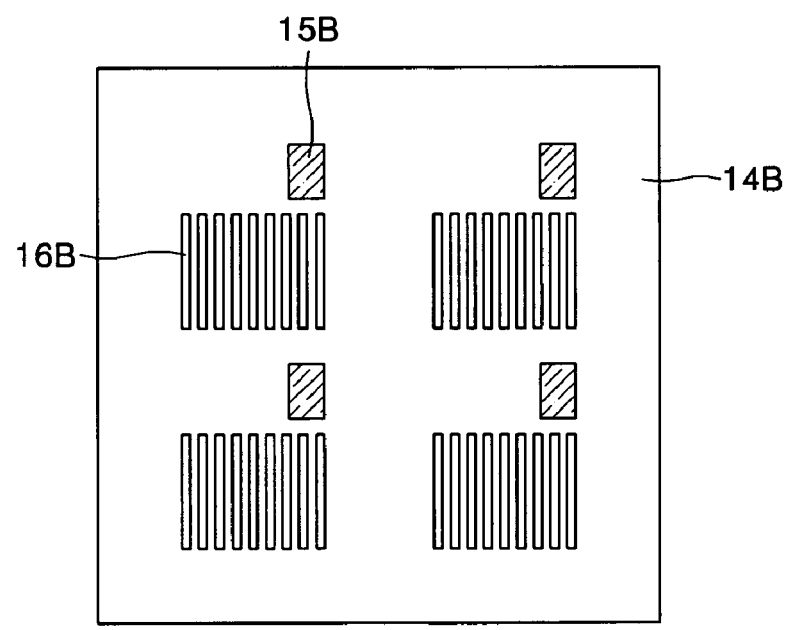

The present invention can be used to manufacture an OLED as illustrated in FIG. 1. As described above, the substrate 10 of FIG. 1 has four panel regions but the present invention is not necessarily limited to this. The present invention can have a plurality of panel regions and have the OLED formed on the respective panel regions.

As described above, the OLED of the respective panels 11 can include an icon part 12 and a main image part 13. The icon part 12 can include a red emission region 12R, a green emission region 12G, and a blue emission region 12B. The main image part 13 can have a red sub-pixel, a green sub-pixel, and a blue sub-pixel so as to realize full color.

Figure 3:
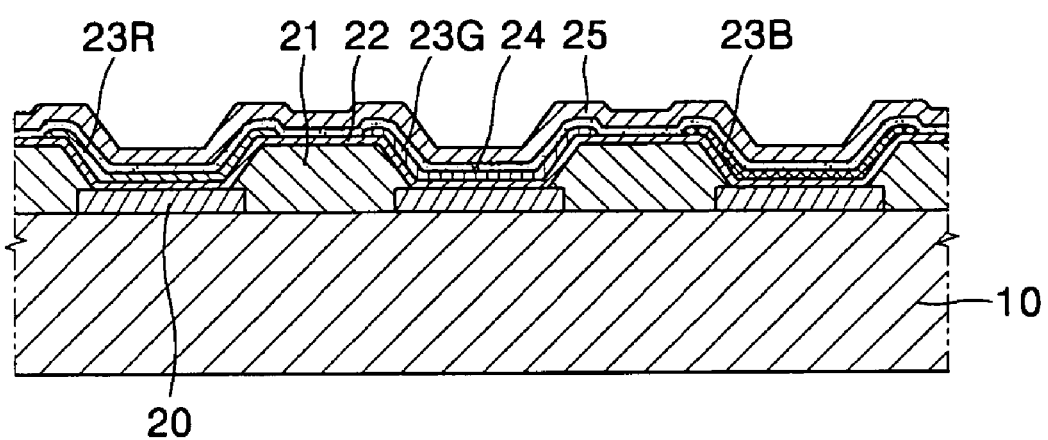
FIG. 3 is a cross-sectional view of a main image part of FIG. 1.

At this point, the icon part 12 and the main image part 13 can have the structure illustrated in FIG. 3. This structure is further detailed below.

First, the first electrode layer 20 may be formed in a predetermined pattern on the substrate 10 and an insulation layer 21 may be formed thereon so that a predetermined portion of the first electrode layer 20 may be exposed. An organic film may be formed on an upper portion of the first electrode layer 20. For the organic film, a hole transport layer (HTL) 22 and an electron transport layer (ETL) 24 may be used as a common layer. A red organic emission layer 23R, a green organic emission layer 23G, and a blue organic emission layer 23B may be formed between the HTL 22 and the ETL 24. The second electrode layer 25 may be formed on an upper portion of the organic film.

The substrate 10 can have a plurality of thin film transistors (TFTs) and storage capacitors on a glass substrate. A buffer layer by SiO2 can be formed on the glass substrate.

The first electrode layer 20 can be used as a hole injection electrode of the OLED. The first electrode layer 20 can be formed using transparent electrodes or reflection-type electrodes. If the transparent electrodes are used for the first electrode layer 20, the transparent electrodes can be made of ITO, IZO, ZnO, or $In_2O_3$. If the reflection-type electrodes are used for the first electrode layer 20, a reflection film may be formed using Ag, Mg, Al, Pt, Pd, Au, Ni, Nd, Ir, Cr, and combinations thereof first and then ITO, IZO, ZnO, or $In_2O_3$ can be formed on the reflection film.

Any organic film that can be used for the OLED can be all applied for the organic film including the organic emission layers 23R, 23G, and 23B. As described above, a hole injection layer (HIL) or an electron injection layer (EIL) can be further provided besides the HTL, the organic EML, and the ETL. Further, for the organic material available, a variety of materials such as copper phthalocyanine(CuPc), N,N'-Di(naphthalene-1-yl)-N,N'-diphenyl-benzidine (NPB), and tris-8-hydroxyquinoline aluminum (Alq3) can be used.

The second electrode layer 25 can also be used as a hole injection electrode of the OLED and can also be formed using transparent electrodes or reflection-type electrodes. If transparent electrodes are used for the second electrode layer 25, metal having low work function such as Li, Ca, LiF/Ca, LiF/Al, Al, Mg, and compound thereof may be deposited to be oriented to a direction of the ETL 24. After that, auxiliary electrodes or bus electrode lines can be formed thereon using material for transparent electrode formation such as ITO, IZO, ZnO, or $In_2O_3$. Alternatively, if reflection-type electrodes are used for the second electrode layer 25, a metal such as Li, Ca, LiF/Ca, LiF/Al, Al, Mg, or a compound thereof may be deposited so that the electrode layer 25 may be formed.

The insulation film 21 may be a region whose predetermined region opens to form a pixel and thus corresponds to a pixel-define film. For the insulation film 21, polyimide, acryl, BCB, $SiO_2$, $SiN_x$, and the like can be used.

In the OLED, the icon part 12 may be configured such that the respective organic EMLs 23R, 23G, and 23B form one region and the respective emission regions emit colors of the relevant organic EMLs. The main image part 13 may be configured such that the organic EMLs are provided for the respective sub-pixels to realize full color. Of course, the icon part 12 can be so configured as to realize full color.

Figure 4:
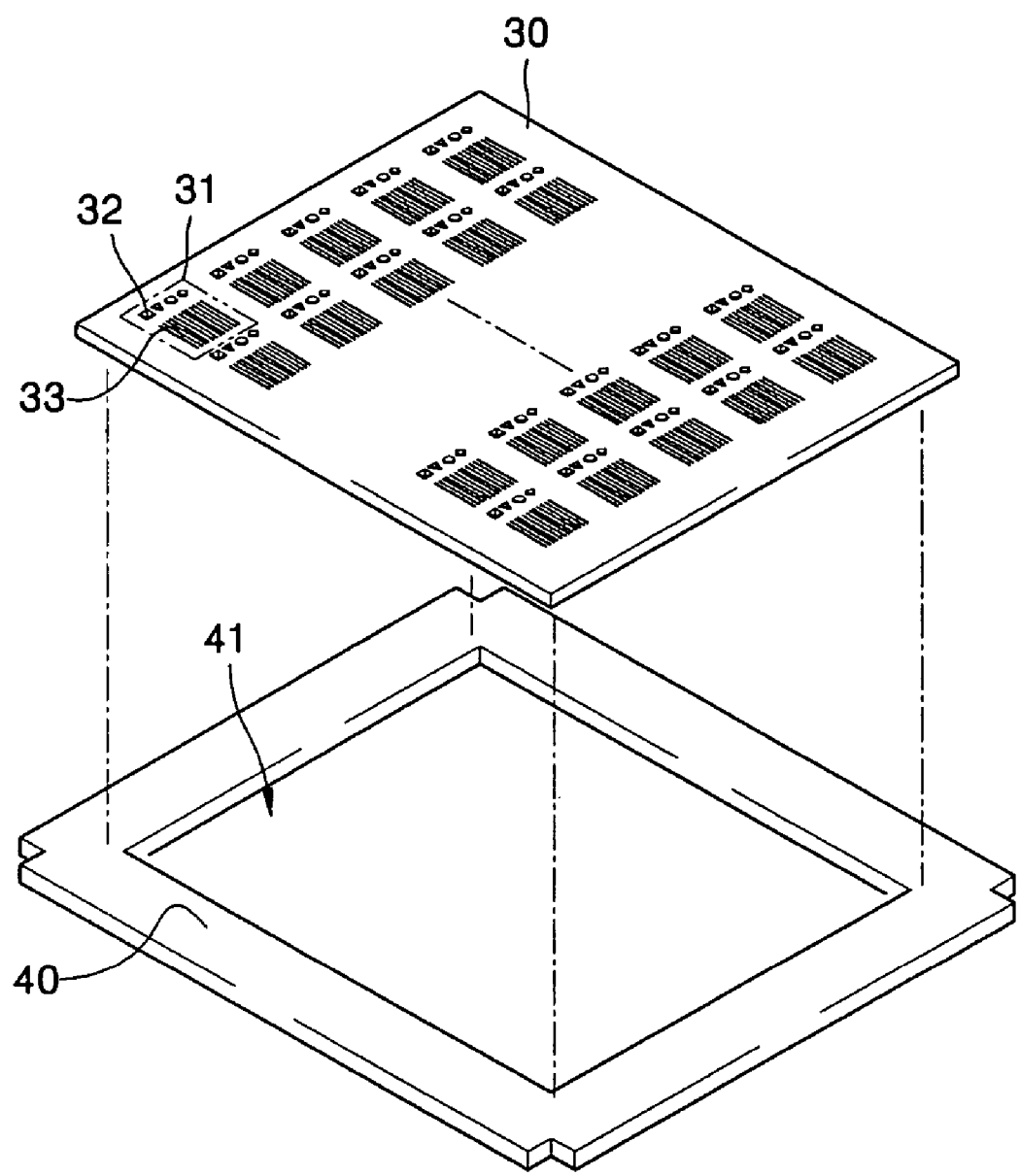
FIG. 4 is an exploded perspective view of a deposition mask according to a preferred embodiment of the present invention.

In the OLED, the organic EML may be formed by being deposited with the deposition mask as illustrated in FIG. 4.

As shown in FIG. 4, the deposition mask according to a preferred embodiment of the present invention can deposit an organic EML of one color and can have a plurality of unit masks 31. The respective unit masks 31 can have an icon masking part 32 for depositing the icon part and a main masking part 33 for depositing the main image part.

The deposition mask 30 may be made of a magnetized thin panel and can be made of nickel or nickel alloy and may be made of nickel-cobalt alloy with which fine patterns are easily formed and whose surface roughness is excellent.

The deposition mask 30 can form openings of the respective icon masking parts 32 and the main masking parts 33 using an electro forming method to obtain fine patterns and excellent surface planarization. Of course, the openings can be manufactured by an etching method. In such a case, after a resist layer having the same patterns as the openings of the respective icon masking parts 32 and main masking parts 33 is formed on a thin panel using a photoresist, or a film having the patterns of the openings is attached to the thin panel first, the thin panel may be etched so that the openings can be manufactured.

The deposition mask 30 manufactured as described above may be given tensile force with its edge fixed by a clamp or an adhesive and joined to a mask frame 40. At this point, the mask frame 40 may have a cavity part 41 so that edge portions except the portions where the respective unit masks 31 are formed can be supported. Though a variety of methods such as joining by an adhesive, laser welding, or resistor heating welding can be applied, laser welding may be preferred because of its accuracy.

Further, though not illustrated in the drawing, to solve a problem of accuracy variations due to bad welding when the deposition mask 30 is welded to the mask frame 40, a cover frame (not shown) may cover an upper portion of the deposition mask 30 where the mask frame 40 and the deposition mask 30 are welded. Thus the welded portion may be secured.

Figure 5:
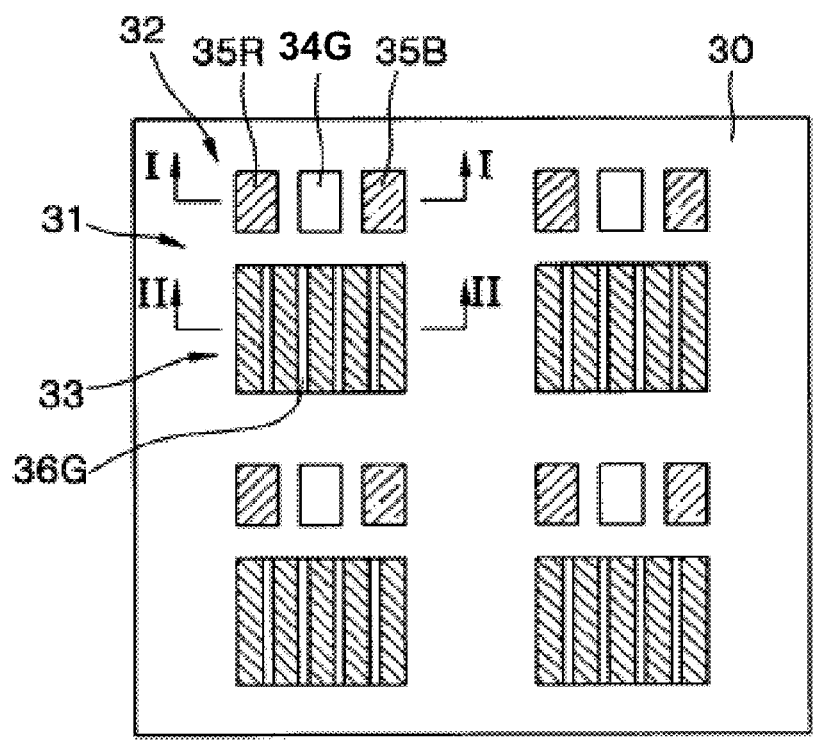
FIG. 5 is a plan view more simply illustrating the deposition mask of FIG. 4.

FIG. 5 is a simpler plan view illustrating the deposition mask in more detail. As shown, only four unit masks 31 are provided and the icon masking parts 32 have an opening for deposition of one color (such as red, green, or blue). The deposition mask illustrated in FIG. 5 is intended for depositing a green organic EML. Since the deposition mask can be applied in the same way for red or blue, only the green organic EML's deposition will be described.

The icon masking part 32 may have a first opening 34G for depositing the green organic EML. The rest (regions 35R and 35B that correspond to red and blue emission regions respectively) may be blocked off.

Also, in the main masking part 33, the second opening 36G may be provided for depositing a green organic EML and regions that correspond to the rest colors are blocked off.

An indentation indented to a predetermined depth may be formed on a side of the mask facing the substrate lest the organic EML should be damaged by the mask.

Figure 6:
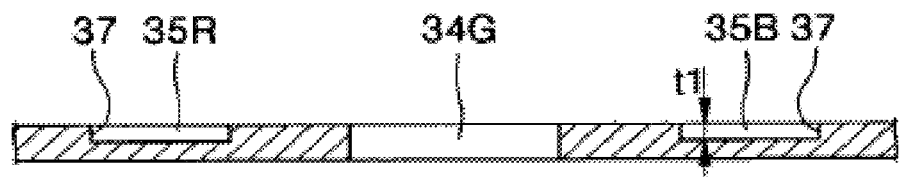
FIG. 6 is a cross-sectional view of FIG. 5 taken along line I-I.
Figure 7:
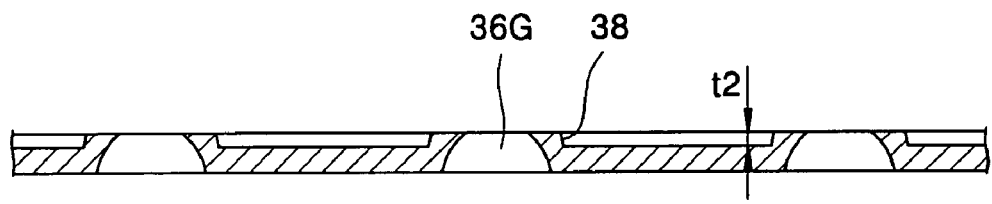
FIG. 7 is a cross-sectional view of FIG. 5 taken along line II-II.

FIG. 6 is a cross-sectional view of the icon making part 32 in FIG. 5 taken along line I-I and FIG. 7 is a cross-sectional view of the main masking part 33 in FIG. 5 taken along line II-II. A plane facing upward in FIGS. 6 and 7 is a plane facing the substrate.

First, as shown in FIG. 6, in the icon masking part 32, the first opening 34G may be formed so as to deposit the green organic EML. The regions 35R and 35B that correspond to red and blue emission regions, respectively, are blocked off and the first indentation 37 indented a predetermined depth is formed. This first indentation 37 is formed with a corresponding area in the regions 35R and 35B that correspond to the red and blue emission regions. The area of the first indentation 37 may be more than areas of the regions 35R and 35B that correspond to the red and the blue emission regions so that the surface of the mask may not touch the organic EML of the red and the blue regions when the green organic EML is deposited.

As shown in FIG. 7, in the main masking part 33, the second opening 36G may be formed so as to deposit the green organic EML. The second indentation 38 may be formed on regions of other colors except a portion where the second opening 36G is formed. For example, this second indentation 38 may be formed over regions that correspond to the blue and the red organic EMLs in the deposition mask where the opening for the green organic EML is formed.

The indentation can be formed in the mask by a half etching. As described above, if the mask is formed by an etching method, the indentation may be formed by half etching when an opening is etched. If the mask is formed by an electro forming method, the indentation can be formed by half etching after going through a separate etching process. However, formation of the indentation is not necessarily limited to this. The indentation can be formed by attaching a separate member without an etching process.

The deposition mask can be modified in various ways by patterns of the organic EML of the OLED to be deposited. An indentation of various patterns can be formed as far as the indentation has a structure that allows the organic EML not to be touched to the blocked-off region of the mask.

For that purpose, the depth the first and the second indentations 37 and 38 are indented should be at least larger than the thickness of the organic EML. If the depth is smaller than this, the organic EML is touched to the mask part and an effect of forming the indentation cannot be obtained. The indentations may have the deposition mask stick to a substrate direction by a magnet member and have a thickness more than 25 μm with consideration of a minimum etched thickness.

The depth of the indentations probably should not exceed about a half of a thickness of the deposition mask. If, for example, the indentations are formed deeply (including more than half a thickness of the deposition mask), the indentations can include protrusions in their ends when the deposition masks are pulled to the substrate direction by the magnet member.

Further, if a tensile force is applied to the deposition mask, the deposition mask can be transformed.

The deposition mask may cover the organic film such that the region where light emission occurs does not touched the mask. Accordingly, the organic film such as the organic EML may not be damaged by roughness of the mask's surface. Additionally, surface impurities and further chemical transition of the surface can be prevented.

Next, a method for manufacturing the OLED using the deposition mask will be described.

First, as shown in FIGS. 1 and 3, the first electrode 20 may be formed on a plurality of panel regions 11 provided on a substrate 10.

If an active matrix-type OLED is to be created, a plurality of thin film transistors and storage capacitors may be preformed on the substrate 10. The first electrode 20 may be connected with a drain electrode of the driving TFT and may be so formed as to correspond to a region where light emission occurs.

If a passive matrix-type OLED is to be created, the first electrode 20 can be formed in a predetermined pattern.

The first electrode 20 manufactured using the above-described material and patterning can be formed by photolithography.

After the first electrode 20 is formed, an insulation film 21 may be spread and patterning may be performed. The insulation film 21 may expose a predetermined portion of the first electrode 20 and may be patterned so that the opening (exposed area) can be covered with an organic film including an organic EML. Since a pixel can be defined during this patterning, the patterned insulation film can be a pixel define layer. This insulation film 21 may have photosensitivity such that the patterning process can be performed easily.

After the insulation film 21 is formed, a HTL 22 may be deposited as a common layer. At this point, a HIL can be further deposited and formed before deposition of the HTL 22.

After the HTL 22 is formed, organic EMLs 23R, 23G, and 23B may be deposited. The organic EMLs can be formed as red, green, and blue organic EMLs 23R, 23G, and 23B. The icon part 12 can allow red, green, and blue emission regions 12R, 12G, and 12B to have a single color, respectively. As shown in FIG. 3, the main image part 13 can allow a sub-pixel having a red organic EML 23R, a sub-pixel having a green organic EML 23G, and a sub-pixel having a blue organic EML 23B to form one pixel so as to realize full color.

Though not shown in the drawing, the deposition may be performed in the following way. Organic material evaporating from a deposition source arranged at a lower point inside a vacuum chamber may pass through the mask and be deposited on a substrate in a predetermined pattern. A magnet member positioned on a plane of the substrate opposite the mask may allow the mask to stick to the substrate.

Figure 8:
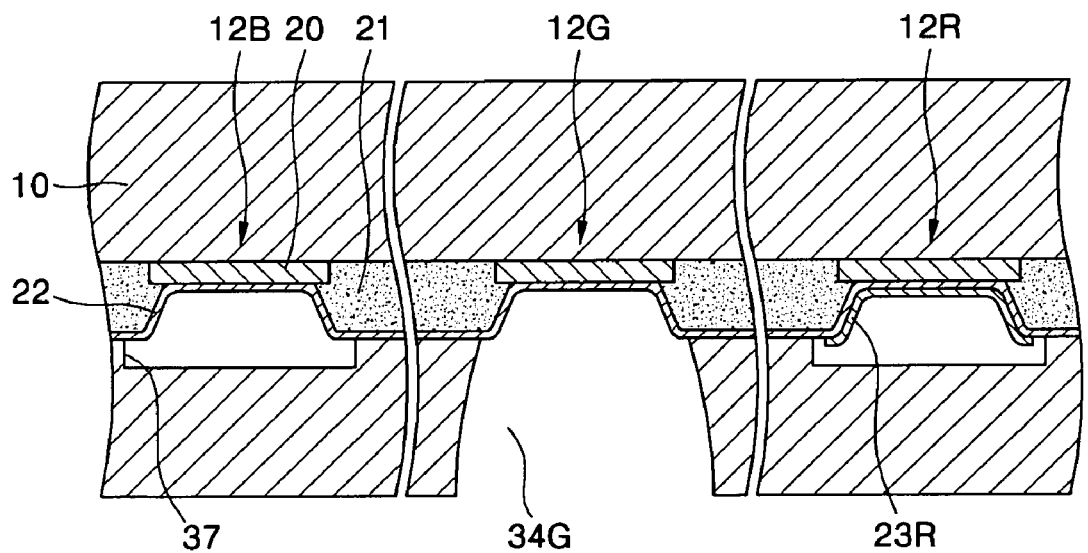
FIG. 8 is a cross-sectional view illustrating a state in which an icon part is deposited using the deposition mask of FIG. 5.

As shown in FIG. 8, the icon part 12 may be deposited by the first opening 34G. The mask may include first indentation 37 that may correspond to a location where icon part 12 is to be (or was previously) deposited. FIG. 8 illustrates a situation in which a green emission region 12G is being deposited, a red emission region 12R was previously deposited, and a blue emission region 12B is about to be deposited.

As shown in FIG. 8, the first indentations 37 may be formed on regions that correspond to the blue emission region 12B and the red emission region 12R. Accordingly, even if the mask sticks to the substrate, the mask may not touch the organic EML already deposited. Thus, the organic EML may not be damaged.

Figure 9:
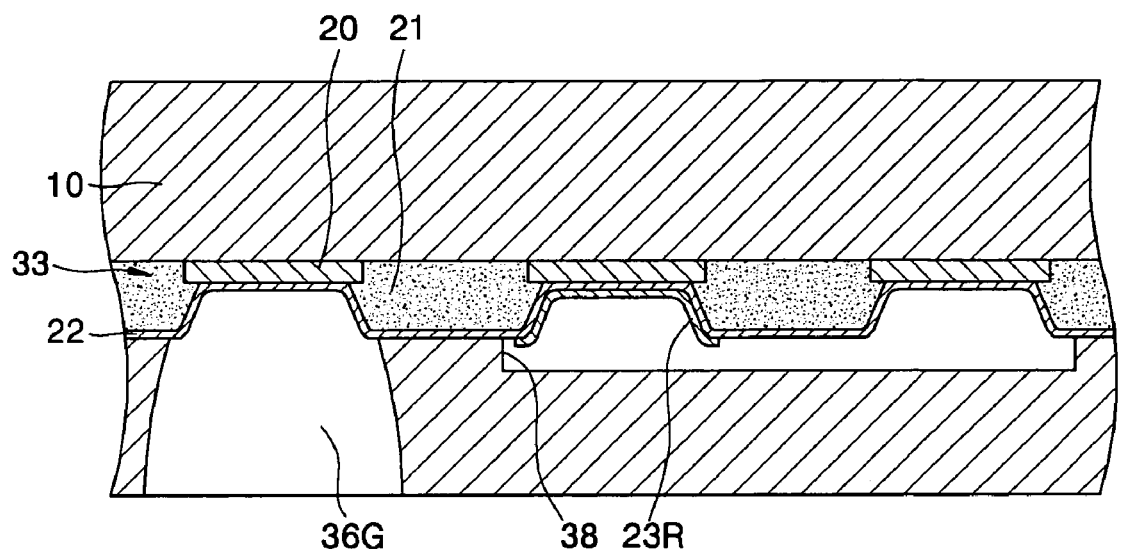
FIG. 9 is a cross-sectional view illustrating a state in which a main image part is deposited using the deposition mask of FIG. 5.

As shown in FIG. 9, for the main image part 13, the deposition mask may have a second indentation 38, and thus the organic EML already deposited may not touch the mask. The second indentation 38 may extend to correspond to the a plurality of regions, such as a plurality of sub-pixel regions.

FIGS. 8 and 9 illustrate a case of a green deposition mask but similar masks may be used for red and blue deposition masks.

After the organic EML is formed, an EIL 24 may be deposited as a common layer and the second electrode layer 25 may be deposited. The second electrode layer 25 may be deposited on an entire portion of the main image part among the panel regions in an active matrix (AM) structure. It may be deposited in a predetermined pattern so as to be perpendicular to the first electrode 20 in a passive matrix (PM) structure.

After the second electrode layer 25 is formed, the respective panel regions 11 may be sealed using a separate glass member or a metal cap and the substrate 10 may be divided by panel region unit.

While the present invention has been particularly shown and described with reference to exemplary embodiments thereof, various changes may be made without departing from the scope of the present invention.

What is claimed is:

1. A method of manufacturing an organic light emitting display, comprising:
    forming a first electrode on a substrate;
    forming an organic emission layer on the first electrode by firmly contacting a mask to the substrate and depositing emission layer material through the mask, wherein the mask has an opening and an indentation that does not contact the substrate, the emission layer material being deposited through the opening but not through the indentation;
    forming a second electrode on an upper portion of the organic emission layer; and
    sealing the substrate;
    wherein when contacting the mask to the substrate, the indentation faces the substrate with a previously deposited organic emission layer being disposed within the indentation;
    wherein the previously deposited organic emission layer is formed in a sub-pixel; and
    wherein the width of the indentation is larger than the width of the sub-pixel.

2. The method of claim 1, wherein the forming of the organic emission layer is performed by depositing organic emission layers of different colors using different masks, the opening of the mask is provided to a region that corresponds to an organic emission layer of a first color and the previously deposited organic emission layer is of a second color different from the first color.

3. The method of claim 1, wherein the indentation is indented from the surface facing the substrate to a depth greater than a thickness of the previously deposited organic emission layer and less than half of a thickness of the mask.

4. The method of claim 1, wherein when contacting the mask to the substrate, the mask contacts a layer that the organic emission layer and the previously deposited organic emission layer are directly formed on.

5. The method of claim 4, wherein when contacting the mask to the substrate, a portion of the mask that contacts the layer is the portion between the opening and the indentation.

6. A method of manufacturing an organic light emitting display, comprising:
    forming a first electrode on a plurality of panel regions of a substrate;
    forming an organic emission layer on the first electrode by firmly contacting a mask to the substrate and depositing emission layer material through the mask, wherein the mask has an opening and an indentation that does not contact the substrate, the emission layer material being deposited through the opening but not through the indentation;
    forming a second electrode on an upper portion of the organic emission layer;
    sealing the substrate; and
    dividing the substrate by panel region unit;
    wherein when contacting the mask to the substrate, the indentation faces the substrate with a previously deposited organic emission layer being disposed within the indentation;
    wherein the previously deposited organic emission layer is formed in a sub-pixel; and
    wherein the width of the indentation is larger than the width of the sub-pixel.

7. The method of claim 6, wherein the forming of the organic emission layer is performed by depositing organic emission layers of various colors using various masks, the opening of the mask corresponds to a region that corresponds to an organic emission layer of a first color and the previously deposited organic emission layer is of a second color different from the first color.

8. The method of claim 6, wherein when contacting the mask to the substrate, the mask contacts a layer that the organic emission layer and the previously deposited organic emission layer are directly formed on.

9. The method of claim 8, wherein when contacting the mask to the substrate, a portion of the mask that contacts the layer is the portion between the opening and the indentation.

* * * * *

UNITED STATES PATENT AND TRADEMARK OFFICE
CERTIFICATE OF CORRECTION

PATENT NO. : 7,618,674 B2  
APPLICATION NO. : 11/180653  
DATED : November 17, 2009  
INVENTOR(S) : Kang et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1160 days.

Signed and Sealed this

Twenty-sixth Day of October, 2010

David J. Kappos  
*Director of the United States Patent and Trademark Office*